United States Patent
Yamamura et al.

(12)
(10) Patent No.: US 6,385,976 B1
(45) Date of Patent: May 14, 2002

(54) THERMOELECTRIC MODULE WITH INTEGRATED HEAT EXCHANGER AND METHOD OF USE

(75) Inventors: Akira Yamamura, Tokyo (JP); Robert Otey, Litchfield, NH (US)

(73) Assignee: Ferrotec (USA) Corporation, Nashua, NH (US)

( * ) Notice: Subject to any disclaimer, the term of this patent is extended or adjusted under 35 U.S.C. 154(b) by 0 days.

(21) Appl. No.: 09/657,426

(22) Filed: Sep. 8, 2000

(51) Int. Cl.$^7$ ................................................. F25B 21/02
(52) U.S. Cl. ............................ 62/3.7; 62/3.2; 136/203
(58) Field of Search ............................. 62/3.1, 3.2, 3.3, 62/3.6, 3.7; 165/58; 136/203, 204

(56) References Cited

U.S. PATENT DOCUMENTS

| | | | | |
|---|---|---|---|---|
| 2,997,514 A | * | 8/1961 | Roeder, Jr. ...................... | 136/4 |
| 3,016,715 A | * | 1/1962 | Pietsch ............................ | 62/3 |
| 3,076,051 A | * | 1/1963 | Haba .............................. | 136/4 |
| 4,306,426 A | * | 12/1981 | Berthet et al. .................... | 62/3 |
| 4,420,940 A | * | 12/1983 | Buffet ............................ | 62/3 |
| 6,226,994 B1 | * | 5/2001 | Yamada et al. ................ | 62/3.7 |

* cited by examiner

Primary Examiner—William Doerrler
Assistant Examiner—Melvin Jones
(74) Attorney, Agent, or Firm—Mesmer & Deleault, PLLC

(57) ABSTRACT

The electrical junctions of either or both sides of a thermoelectric module are placed in direct thermal contact with a heat source or sink or a material to be thermally modified (that is, heated or cooled), thereby eliminating the conventional substrate typically found in such modules and its associated thermal resistance. In one embodiment, the conductive junction passes through a conduit carrying a material to be heated or cooled. In the conduit, the conductive material can be configured into an effective heat transfer shape such as a vane which extends through non-conducting conduit walls. In another embodiment, the geometry of the conductor forming the electrical junction forms a pipe or tube through which material to be heated or cooled is passed. A protection layer of high thermal conductivity can be applied to the conductive surfaces in order to prevent corrosion or short-circuiting of the device in applications where an electrolytic or ionic fluid is passed by the junction.

20 Claims, 5 Drawing Sheets

THERMOELECTRIC MODULE WITH INTEGRATED HEAT EXCHANGER AND METHOD OF USE

FIELD OF THE INVENTION

This invention relates to heat transfer devices and, more particularly, to thermoelectric heat transfer devices.

BACKGROUND OF THE INVENTION

Thermoelectric modules are solid-state devices that convert electrical energy to a temperature gradient by using an effect known as the "Peltier effect." Alternatively, thermal energy can be applied to such devices by placing a temperature gradient across them to generate electrical energy due to an effect known as the "Seebeck effect."

When an appropriate electrical voltage is applied, from a battery or other DC source, to a thermoelectric module, one side of the module becomes cold while the other side of the module becomes hot. The "hot" and "cold" sides of the module depend on the current flow through the device; if the voltage polarity across the module is reversed thereby causing a reverse in the current flow the module "cold" side will become the "hot" side and vice versa. Thermoelectric modules are typically used by placing them between a heat source and a heat sink, such as a liquid plate, a surface plate, or a convection heat sink. The thermoelectric module will absorb heat on its "cold" side from the heat source and transfer the heat to its "hot" side and to the heat sink.

A conventional thermoelectric module is composed of an array of thermoelectric elements called "dice" which are generally fabricated from Bismuth Telluride and are available in P-types and N-types. The P-type and N-type materials are alloys of Bismuth and Tellurium that have different free electron densities at the same temperature. P-type dice are composed of material having a deficiency of electrons while N-type dice are composed of a material having an excess of electrons. Most modules have an equal number of P-type and N-type dice and one die of each type sharing an electrical interconnection is known as a "couple." When an electrical current flows through the couple, it attempts to establish a new equilibrium within the materials. The direction of the current will determine if a particular side will cool down or heat up.

The array of P-type and N-type thermoelectric elements are electrically connected in a series chain of couples with alternating element types connected by electrical junctions. When so connected, the electrical junctions form the hot and cold sides of the device with alternating junctions becoming hot and cold, respectively when electrical power is applied to the chain.

In order to form a compact and physically rugged module, the dice are conventionally sandwiched between two ceramic substrates that provide mechanical rigidity and electrical insulation. The P-type and N-type dice are connected electrically in series by electrically conductive materials, usually metal pads, plated on, or attached to, the ceramic substrates. The dice are generally soldered to the pads for mechanical strength.

Such a module is illustrated in FIGS. 1A and 1B, which are cross-sections and top views, respectively, of a thermoelectric module 100. In FIG. 1A, the module 100 is shown sandwiched between a finned convection style heat sink 102 and a heat source 104. In FIG. 1B, the heat sink 102 and the upper substrate 106 have been removed to expose the metal pads that interconnect the thermoelectric elements.

Three such elements 110, 112 and 114 are shown in Figure 1A. As mentioned above, the elements are connected in couples such that P-type dice alternate with N-type dice. For example, thermoelectric elements 110 and 112 are electrically interconnected by electrical pad 116. Similarly, elements 112 and 114 are connected by pad 120. Pads 118 and 122 connect elements 110 and 114 to other elements (not shown.)

FIG. 1B shows a top view that has been exposed to illustrate the electrical interconnections. As shown pads 116, 120, 122, 124, 126, 128, 130 and 132 connect eight thermoelectric elements in series. Element 134 would also be connected by an electrical pad (not shown) to either another element or an electrical power source. This conventional construction is disclosed in several references including the "CRC Handbook of Thermoelectrics, and Thermoelectric Refrigeration" by H. J. Goldsmid.

While such devices work well, the efficiency is limited by the conventional construction. The most common type of material used to fabricate substrates 106 and 108 is 96% alumina. This material has poor thermal conductivity for example approximately 35 watts/m ° C. Since heat, which is transferred from the heat source 104 to the heat sink 102, must pass through two substrates 108 and 106, both of which have poor conductivity, the efficiency of the device is reduced.

Therefore, there is a need for a thermoelectric device with improved thermal efficiency.

SUMMARY OF THE INVENTION

In accordance with the principles of the invention, the electrical junctions of either or both sides of a thermoelectric module are placed in direct thermal contact with a heat source or sink or a material to be thermally modified (that is, heated or cooled), thereby eliminating the conventional substrate and its associated thermal resistance. An electrically conductive material such as copper, aluminum or any other known electrical conductor exhibiting relatively high thermal conductivity can be used as the electrical junction between a pair of thermoelectric elements and at the same time function as the transfer medium for the thermal energy produced by the elements.

In one embodiment, the conductive junction passes through a conduit carrying a material to be heated or cooled. In the conduit, the conductive material can be configured into an effective heat transfer shape such as a vane that extends through a non-conducting tube or pipe.

In another embodiment, the geometry of the conductor forming the electrical junction forms a pipe or tube through which material to be heated or cooled is passed.

The use of the inventive module eliminates the need for separate heat exchange devices such as heatsinks, liquid plates, etc., therefore reducing the size of the heat exchanger as well as increasing efficiency by eliminating interfaces between devices.

Additionally this invention can be highly effective in the transfer of waste heat into useable electrical energy. The reduced size and increased efficiency of this design can be effectively used in applications such as automotive exhaust pipes and radiators where the thermoelectric device is built into the apparatus. Many other uses could be considered including steam pipes, process piping, ventilation systems, etc.

In still another embodiment, a protection layer of high thermal conductivity can be applied to the conductive surfaces in order to prevent corrosion or short-circuiting of the device in applications where an electrolytic or ionic fluid is passed by the junction.

BRIEF DESCRIPTION OF THE DRAWINGS

The above and further advantages of the invention may be better understood by referring to the following description in conjunction with the accompanying drawings in which.

DETAILED DESCRIPTION

Figure 1A:
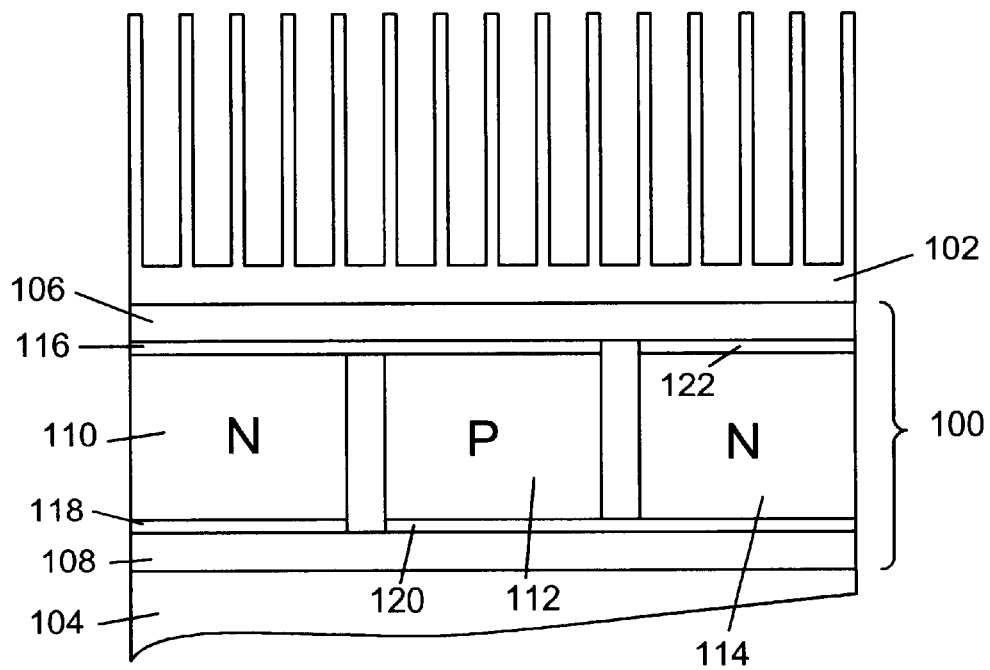
FIG. 1A is a cross-sectional view of a conventional thermoelectric module illustrating the substrates, thermoelectric elements and connections.
Figure 1B:
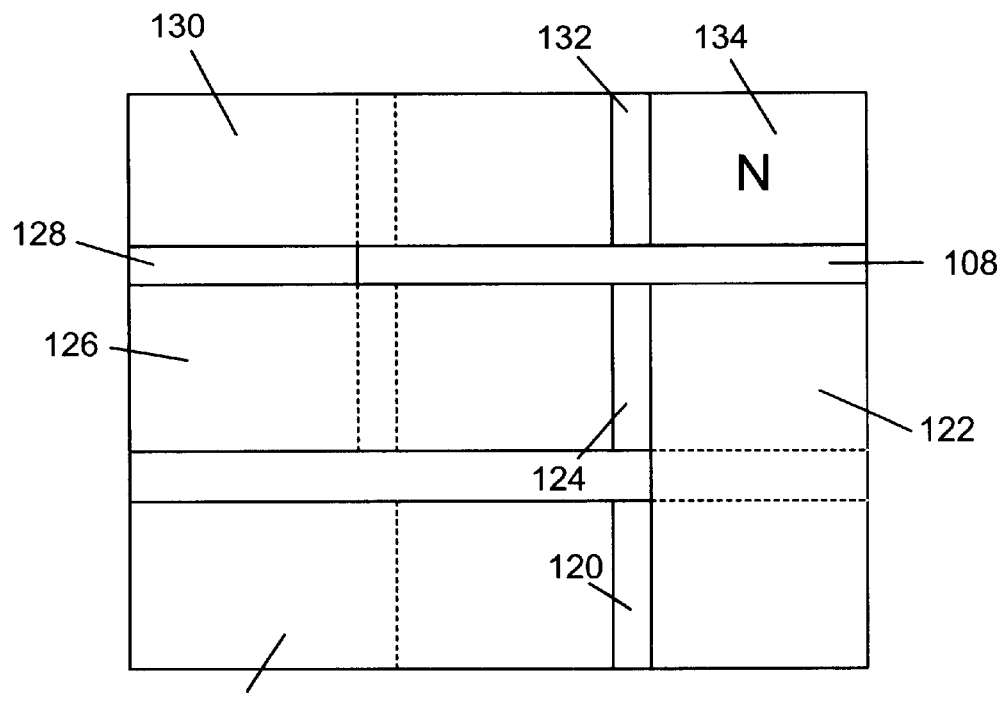
FIG. 1B is a top view of the device shown in FIG. 1A with overlaying heat sink and top substrate removed in order to expose the electrical connections.
Figure 2A:
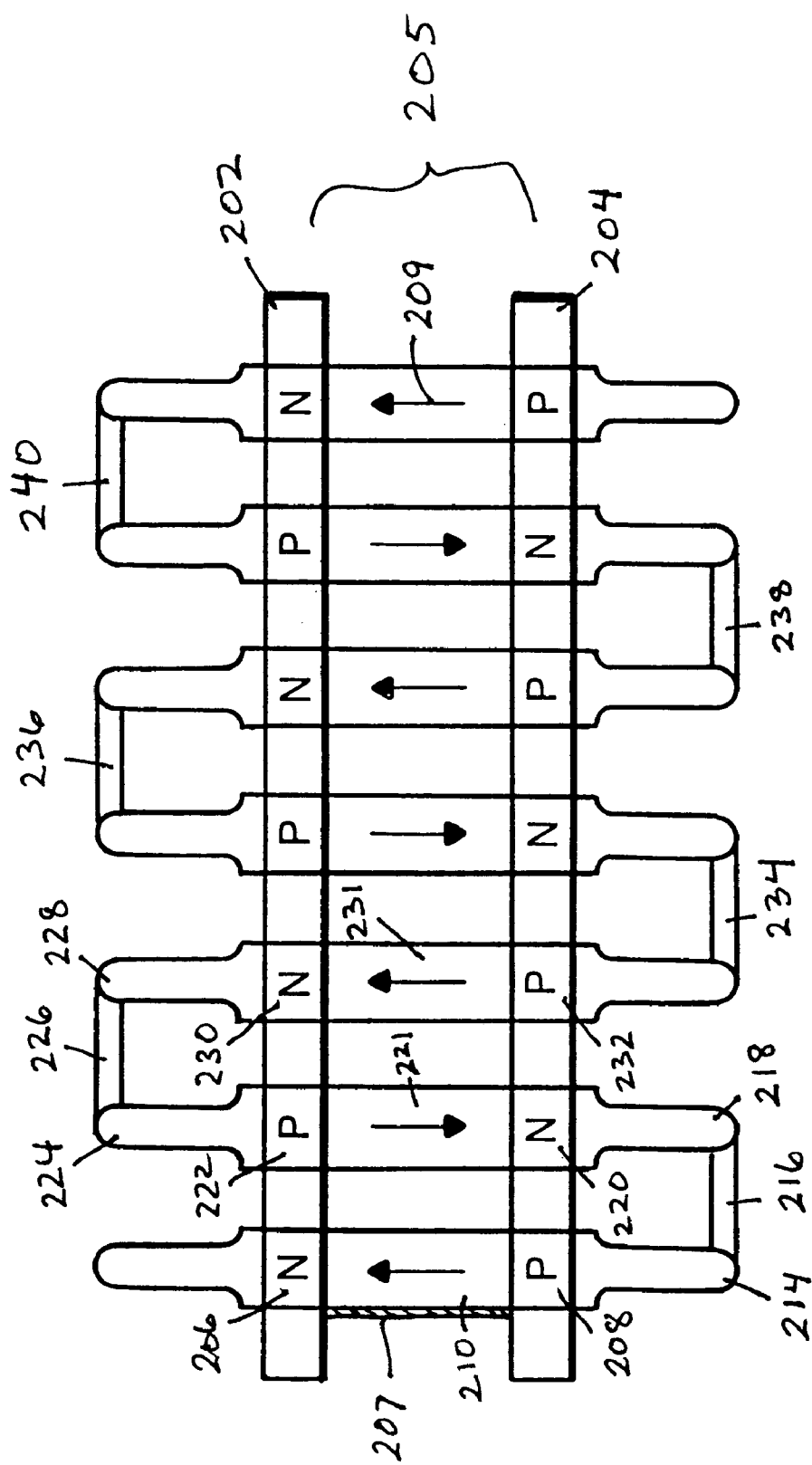
FIG. 2A is a front view of a first embodiment of the invention in which the conductive junctions of a thermoelectric module pass through a conduit carrying a material to be heated or cooled.
Figure 2B:
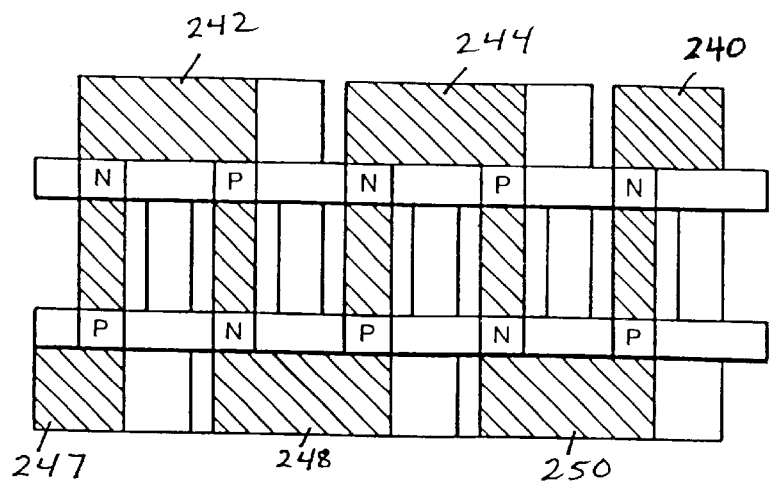
FIG. 2B is a side view of the embodiment illustrated in FIG. 2A showing the junctions passing through the conduit.
Figure 2C:
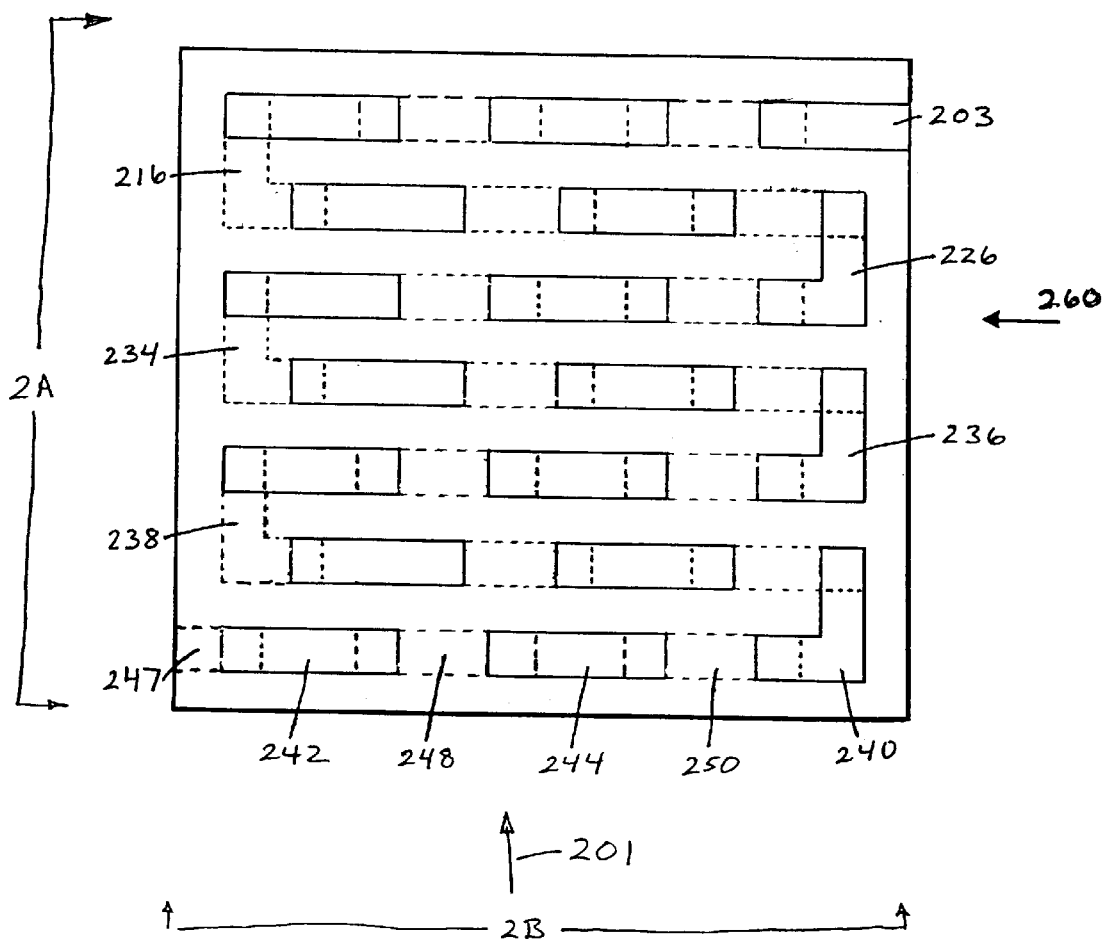
FIG. 2C is a top view of the embodiment illustrated in FIG. 2A showing the junctions passing through the conduit.

FIGS. 2A, 2B and 2C show side, front and top views, respectively, of a first illustrative embodiment of the invention. In the orientation shown, the side view of FIG. 2A and the front view of FIG. 2B correspond to the directions indicated by the section lines shown in the top view of FIG. 2C. In this embodiment, a material to be heated or cooled passes, as indicated by arrow 201, through a conduit 205 having top 202 and bottom 204 walls that are constructed of an electrically insulating material, such as a polymeric or fiber material. The conduit 205 also has end walls (not shown) that confine the fluid in the conduit. Embedded in (or alternatively mounted on the surface of) the top wall 202 is an alternating series of thermoelectric elements 206, 222, 230, etc. On the opposite wall 204, another alternating series of thermoelectric elements 208, 220, 232, etc. are attached or embedded.

The elements are connected by electrical conductors to form a series connection with thermoelectric elements of P-type and N-type being connected in an alternating series in order to form a thermoelectric chain. For example, elements 206 and 208 are connected by electrical conductor 210 which extends inside the conduit 205, elements 222 and 220 are connected by electrical conductor 221, and elements 230 and 232 are connected by electrical conductor 231.

In a similar manner, elements 208 and 220 are connected by electrical conductors 214, 216 and 218, which extend outside the conduit, and elements 222 and 230 are connected by electrical conductors 224, 226 and 228. Conductors 234, 236, 238 and 240 make similar connections, as do conductors 242, 244, 248 and 250. The electrical connections connect the thermoelectric elements into an array in a manner similar to that of conventional thermoelectric modules. The series chain of thermoelectric elements are connected by conductors 247 and 203 to an electrical power source so that current flows in the direction of arrows 209 in order to power the thermoelectric module in a conventional manner.

The vertical conductors 214, 218, 224, 228, etc. are arranged to form the "fins" of a heat sink outside of conduit 205 over which a second fluid can flow outside the conduit in the direction of arrow 260. The heat sink fins transfer heat to the second fluid.

In accordance with the principles of the invention, the electrical conductors that connect either the hot or cold sides of the thermoelectric elements, pass directly through the conduit 205 and are in direct thermal contact with the material to be heated or cooled. For example, conductors 210 and 221 pass through conduit 205 and thus directly contact the material in the conduit 205. The conductors are fabricated from a material that is both a good electrical and a good thermal conductor, such as copper, aluminum, or other metal. Therefore, heat in the material in conduit 205 will be conducted through the conductor directly to a thermoelectric element without passing through a substrate.

In a similar manner, the thermoelectric elements are in-direct thermal contact with the conductors 214, 218, 224 and 228 that form the fins of a heat sink. The alumina substrates present in the prior art thermoelectric modules are thereby eliminated, resulting in increased heat transfer and thermal efficiency.

In order to further increase thermal efficiency, although conductors 210, 221, etc. are shown as thin plates within the conduit 205, one or more of the conductors 210, 221, etc. can be configured into an effective heat transfer shape such as a fin or vane to further increase the heat transfer efficiency.

In another variation, a protective layer 207 can be applied to conductors 210, 221, etc. which lie inside the conduit 205 in order to protect the conductors from a chemical interaction between the conductors and the material in the conduit. Such a coating is shown in FIG. 2A on one side of conductor 210 as an example. Those skilled in the art will understand that such a coating material, if used, would cover all exposed surfaces of the conductors in conduit 205. A similar material may also be applied to the conductors outside of the conduit 205. This is particularly important in order to prevent corrosion or short-circuiting of the device in applications where an electrolytic or ionic material is passed by the conductors. This protective layer may be produced by passivating the conductors or by applying some other protective material to the conductors. In either case the protective coating should be made out of thermally conductive material or should be thin so as not to impede heat flow between the conductors and the material.

Figure 3:
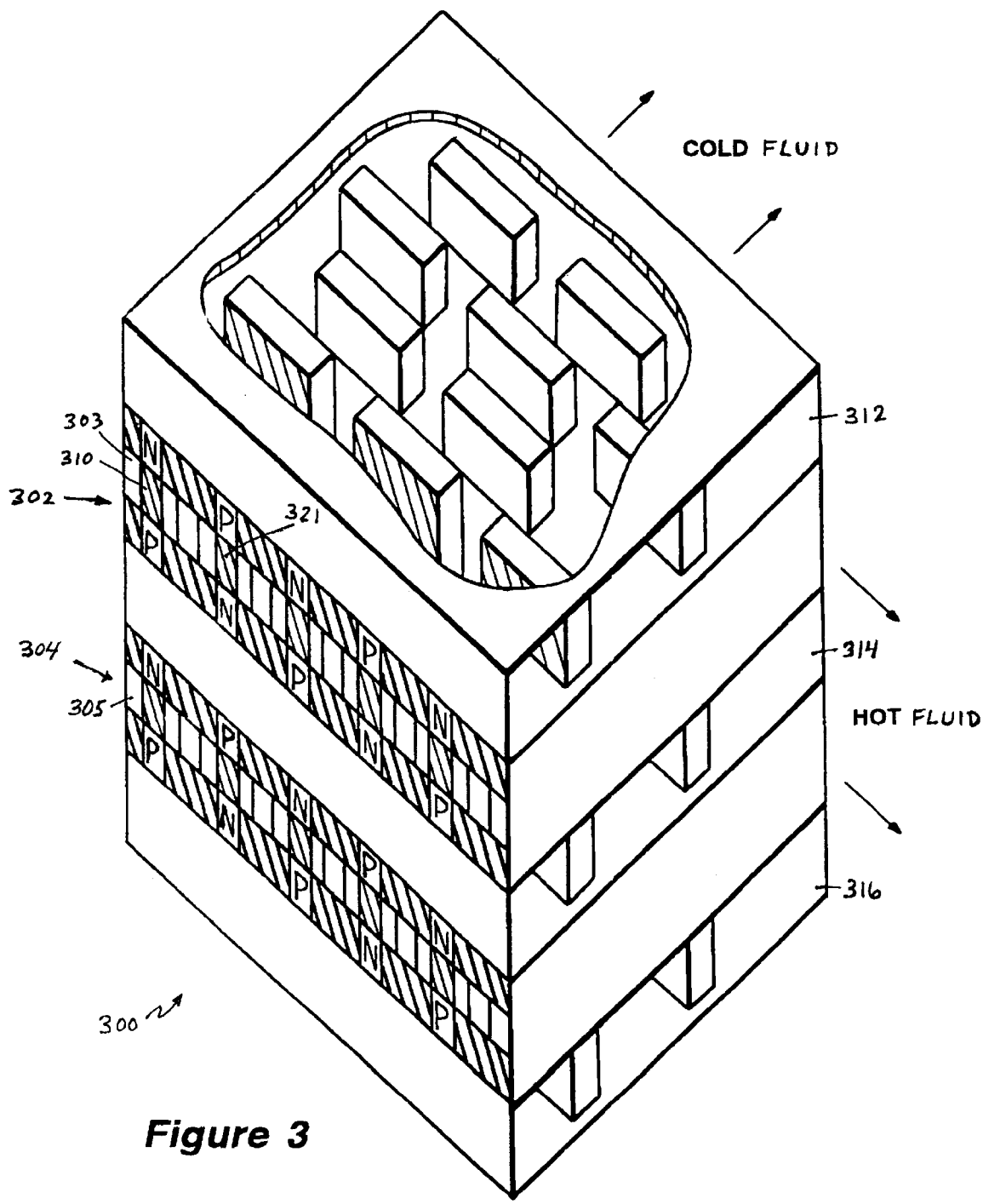
FIG. 3 is a perspective view of a system using several assemblies like those shown in FIGS. 2A–2C.

Shown in FIG. 3 is a perspective view of a system making use of a multiple layer thermoelectric arrangement. The thermoelectric unit 300 has conduits through which air or some other fluid passes in perpendicular directions. Upper and lower thermoelectric systems 302, 304 are each essentially identical to the unit shown in FIGS. 2A–2C, and each has a current flowing through alternating P-type and N-type thermoelectric elements. For example, the thermoelectric elements of system 302 are part of two separate layers, in between which a conduit 303 is formed through which fluid flows past conductors 310, 321, etc. With the electrical current traveling in a first direction, the material in the conduit 303 is exposed to the cold side of each thermoelectric element and, by the time it reaches the rear side of the unit 300, it has been reduced in temperature. Thermoelectric system 304 operates in a manner identical to that of system 302, and will not be described in detail herein.

As shown in FIG. 3, the conductive portions of the system 302 that are located to the sides of the thermoelectric elements away from the conduit 303, extend into perpendicular flow paths 312 and 314. Likewise, the conductive portions of system 304 located to the sides of the thermoelectric elements away from conduit 305 extend into perpendicular flow paths 314 and 316. Each surface within which thermoelectric elements are embedded, or to which thermoelectric elements are attached, serves to separate each conduit from adjacent conduits, thereby preventing mixing of the flowing materials. Because the electrical conductors extending into the conduits 312, 314 and 316 are each attached to the hot side of their respective thermoelectric elements, the air that flows through conduits 312, 314 and 316 of the thermoelectric unit is heated by the conductive portions therein. Similarly, fluid flowing through conduits 303 and 305 is cooled by the conductors therein, each of which is in thermal contact with the cold side of a thermoelectric element.

The embodiment of FIG. 3 provides an example of a system that may provide desired heating and/or cooling to a fluid or fluids. Those skilled in the art will recognize that this system may as easily be used as an electrical generator by providing fluid flowing through conduits 303 and 305 that is at a distinctly different temperature than fluid flowing through conduits 312, 314 and 316. Such fluid flow will produce a thermal gradient on the thermoelectric elements of each system, resulting in the development of a DC electrical current in a direction dependent on which of the hotter and cooler fluids flow through which conduits. It will also be recognized that any number of desired thermoelectric systems like that of system 302 and system 304 may be organized in a unit such as that shown in FIG. 3, with interleaved conduits like conduits 312, 314 and 316 separating the systems. These systems may also be arranged such that the electrical current flow continues from one system to the next, making for a single electrical circuit. Moreover, the compact shape of the unit may allow it to be used in a number of different capacities. For example, a unit such as that shown in FIG. 3 might be implemented to provide supplemental electrical energy in an automobile by routing hot exhaust gases through conduits in one direction, and cool fresh air through the conduits in the perpendicular direction. Naturally, many other similar uses for such a system exist.

Figure 4:
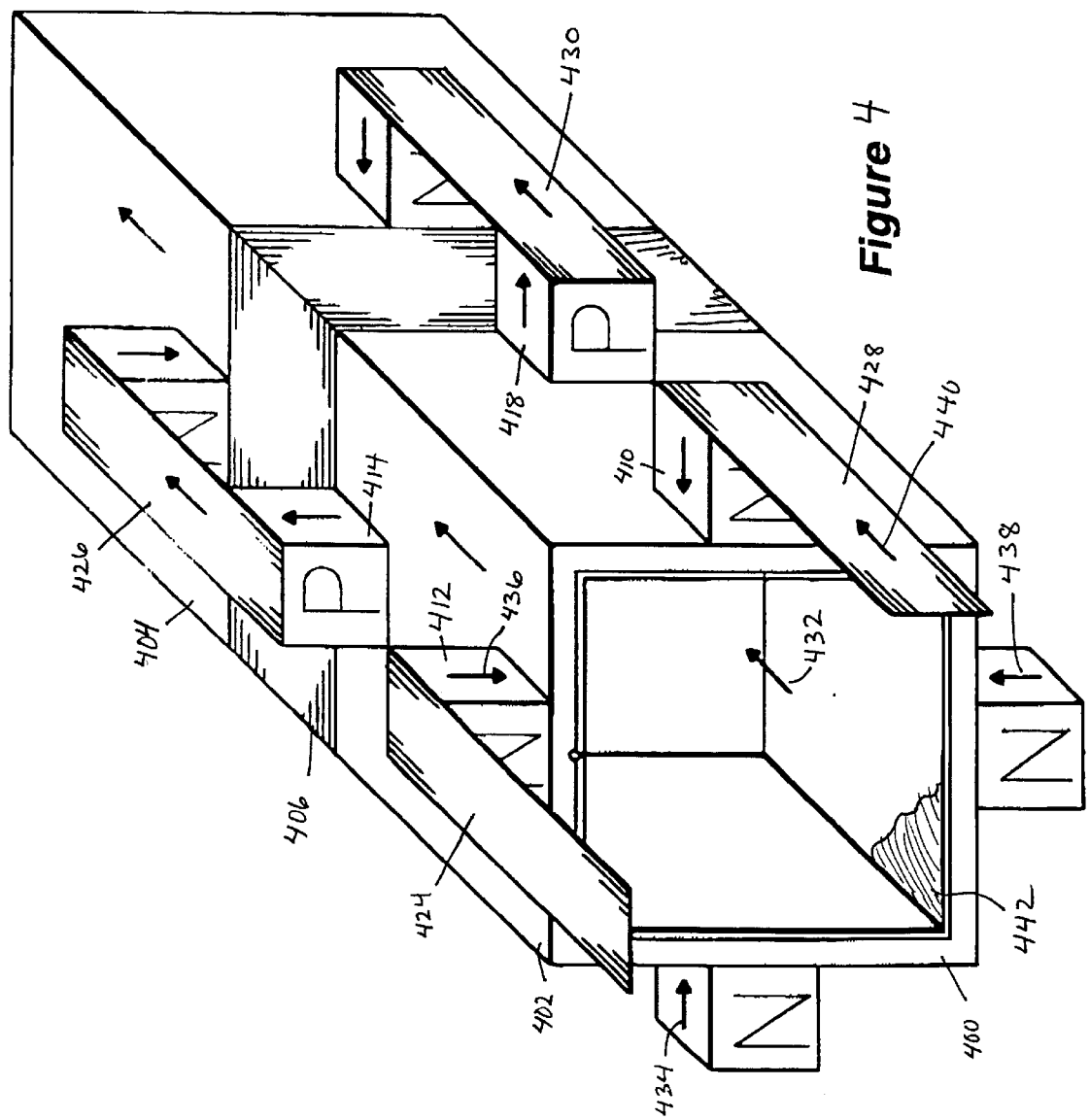
FIG. 4 is a perspective view of another embodiment of the invention in which the conductive junctions are configured as the walls of a conduit carrying a material to be heated or cooled.

A perspective view of an alternative embodiment of the invention is illustrated in FIG. 4. In this embodiment, a conduit, which carries the material that is cooled or heated, is formed from the conductors that are part of the thermoelectric module. In particular, the difference between the embodiment shown in FIG. 4 and the aforementioned embodiments is that, in those other embodiments, the electrical conductors that comprise the electrical junctions of one side of the thermoelectric module pass through a material-carrying conduit, whereas in FIG. 4, the electrical in connectors themselves form the walls of the conduit. In particular, FIG. 4 shows a section of an electrically conducting conduit 400 that is formed of sections 402 and 404. The conduit sections are separated by an electrically insulating coupling 406. Thermoelectric elements are attached on any or all sides of the conduit in a manner such that the conduit walls themselves constitute the electrical connections between the pairs of elements. For examples, the walls of conduit 402 electrically connect elements 412 and 414 and elements 410 and 418. The elements are further connected together by external electrical connectors such as connectors 424, 426, 428 and 430. In this manner, the electrical connections, which constitute either the cold or, the hot side of the thermoelectric module constitute the conduit sections themselves. When the conductors 424 and 428 and others (not shown) are connected to an appropriate electrical energy source, current flows in the directions of arrows 434, 436, 438 and 440 to cause the conduit walls to heat or cool depending on the direction of current flow. Materials move through the conduit as indicated by arrow 432 and are cooled or heated by direct thermal contact with the walls of the conduit.

As with the previous embodiment, a protective layer 442 can be applied to the inner conduit walls in order to protect the conduit from a chemical interaction between the conduit and the material in the conduit. Only a small section of such a coating 442 is shown in the figure. This protective layer can be formed by passivation or other suitable coating techniques.

Although exemplary embodiments of the invention have been disclosed, it will be apparent to those skilled in the art that various changes and modifications can be made which will achieve some of the advantages of the invention without departing from the spirit and scope of the invention. For example, it will be obvious to those reasonably skilled in the art that, although the description was directed to conduits with particular shapes and cross-sections, that other designs could be used in the same manner as that described. Other aspects, such as the specific connections between thermoelectric elements and the configuration of the elements, as well as other modifications to the inventive concept are intended to be covered by the appended claims.

What is claimed is:

1. A thermoelectric module for thermally modifying a material, the module comprising:

at least one P-type thermoelectric element;

at least one N-type thermoelectric element; and an electrical connection between the P-type element and the N-type element, the electrical connection being positioned in direct thermal contact with the material and wherein the P-type element and the N-type element abut the electrical connection.

2. The thermoelectric module of claim 1 wherein the electrical connections are shaped as plates.

3. The thermoelectric module of claim 1 wherein the material is carried in a conduit having a wall and the electrical connection forms at least a portion of the conduit wall.

4. The thermoelectric module of claim 3 wherein the electrical connection forms the entire conduit wall.

5. The thermoelectric module of claim 1 wherein the material is a heat source.

6. The thermoelectric module of claim 1 wherein the material is a heat sink.

7. The thermoelectric module of claim 1 wherein the electrical connection is covered with a protection layer to prevent a chemical interaction between the electrical connection and the material.

8. A thermoelectric module for heating and cooling a material, the module comprising:

a plurality of P-type thermoelectric elements;

a plurality of N-type thermoelectric elements;

a plurality of electrical connections connecting the P-type and N-type elements electrically in series with P-type and N-type elements alternating wherein some of the electrical connections form a hot side set and some of the electrical connections form a cold side set; and a conduit through which the material passes, the conduit establishing a direct thermal contact with the material with a selected one of the hot side electrical connection set and the cold side electrical connection set.

9. The thermoelectric module of claim 8 wherein a portion of each of the electrical connections in the selected electrical connection set passes through the conduit.

10. The thermoelectric module of claim 9 wherein the portion of each of the electrical connections in the selected electrical connection set inside of the conduit is covered with a protection layer to prevent a chemical interaction between the portion and the material.

11. The thermoelectric module of claim 8 wherein the conduit has a wall and the electrical connections in the selected electrical connection set form at least a portion of the conduit wall.

12. The thermoelectric module of claim 11 wherein the electrical connections in the selected electrical connection set form the entire conduit wall.

13. The thermoelectric module of claim 8 wherein the electrical connections are formed from a metal.

14. The thermoelectric module of claim 8 wherein the conduit is comprised of metal tube sections having an outside and being separated by electrically insulating couplings and wherein the P-Type and N-type thermoelectric elements are mounted on the outside of the tube sections so that the tube sections serve as one set of electrical connections between the P-type and N-type elements.

15. The thermoelectric module of claim 14 wherein the inside of the conduit is covered with a protection layer to prevent a chemical interaction between the conduit and the material.

16. A method for thermally modifying a material with a thermoelectric module having at least one P-type thermoelectric element, at least one N-type thermoelectric element and an electrical connection between the P-type element and the N-type element, the method comprising bringing the electrical connection into direct thermal contact with the material.

17. The method of claim 16 wherein the material is carried in a conduit and the method comprises passing the electrical connection through the conduit.

18. The method of claim 16 wherein the material is carried in a conduit having a wall and the method comprises using at least a portion of the conduit wall to form the electrical connection.

19. The method of claim 18 wherein the electrical connection is formed by the entire conduit wall.

20. The method of claim 16 further comprising the step of covering the electrical connection with a protection layer to prevent a chemical interaction between the electrical connection and the material.

\* \* \* \* \*